US010547157B2

(12) United States Patent
Werkstetter

(10) Patent No.: US 10,547,157 B2
(45) Date of Patent: Jan. 28, 2020

(54) CONTROL APPARATUS FOR DRIVING A LASER DIODE

(71) Applicant: Bayerische Motoren Werke Aktiengesellschaft, Munich (DE)

(72) Inventor: Mario Werkstetter, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 14/610,881

(22) Filed: Jan. 30, 2015

(65) Prior Publication Data

US 2015/0146754 A1   May 28, 2015

Related U.S. Application Data

(63) Continuation of application No. PCT/EP2013/065725, filed on Jul. 25, 2013.

(30) Foreign Application Priority Data

Aug. 2, 2012   (DE) .......................... 10 2012 213 670

(51) Int. Cl.
*H01S 5/068* (2006.01)
*H01S 5/026* (2006.01)
(Continued)

(52) U.S. Cl.
CPC ............ *H01S 5/0261* (2013.01); *F21S 41/14* (2018.01); *F21S 41/16* (2018.01); *F21S 41/60* (2018.01);
(Continued)

(58) Field of Classification Search
CPC ..... H01S 5/042; H01S 5/06825; H01S 5/0428
(Continued)

(56) References Cited

U.S. PATENT DOCUMENTS 6,195,370 B1    2/2001  Haneda et al.
6,629,638 B1 * 10/2003  Sanchez ........................ 235/454
(Continued)

FOREIGN PATENT DOCUMENTS

CN           1717849 A      1/2006
CN         102313220 A      1/2012
(Continued)

OTHER PUBLICATIONS

International Search Report dated Sep. 30, 2013 (Three (3) pages).
(Continued)

*Primary Examiner* — Tod T Van Roy
(74) *Attorney, Agent, or Firm* — Crowell & Moring LLP

(57) ABSTRACT

A control apparatus for driving a laser diode comprises an output connection for connecting the laser diode, a regulation device for generating an output signal, a detector device which is designed to determine a regulation variable when the regulation device provides the output signal and the laser diode is connected to the output connection. The control apparatus furthermore comprises a computer device for providing a control signal for the regulation device, wherein the computer device provides the control signal independently of the regulation variable. The regulation device is designed in such a way that it generates a level for the output signal depending on the control signal and the determined regulation variable.

21 Claims, 2 Drawing Sheets

(51) Int. Cl.
*F21S 41/14* (2018.01)
*F21S 41/60* (2018.01)
*F21S 41/16* (2018.01)
*H01S 5/042* (2006.01)
*F21W 102/00* (2018.01)
*H01S 5/06* (2006.01)

(52) U.S. Cl.
CPC ........ *H01S 5/0428* (2013.01); *H01S 5/06804* (2013.01); *H01S 5/06808* (2013.01); *F21W 2102/00* (2018.01); *H01S 5/0617* (2013.01)

(58) Field of Classification Search
USPC ..... 372/29.011, 29.015, 38.01, 38.02, 38.07, 372/38.08
See application file for complete search history.

(56) References Cited

U.S. PATENT DOCUMENTS

| | | |
|---|---|---|
| 8,073,300 B2 | 12/2011 | Härle et al. |
| 9,214,783 B2 * | 12/2015 | Nomura .................... H01S 5/00 |
| 2001/0036211 A1 | 11/2001 | Iida |
| 2005/0109041 A1 * | 5/2005 | Tanaka .............................. 62/3.7 |
| 2006/0182158 A1 | 8/2006 | Tateishi et al. |
| 2006/0291510 A1 * | 12/2006 | Juluri ....................... 372/29.021 |
| 2007/0171947 A1 * | 7/2007 | Bell ........................... 372/38.08 |
| 2007/0286609 A1 * | 12/2007 | Ikram .................. H04B 10/564 398/197 |
| 2008/0157678 A1 | 7/2008 | Ito et al. |
| 2010/0001659 A1 * | 1/2010 | Inoue .................. H05B 33/0815 315/291 |
| 2010/0329293 A1 * | 12/2010 | Taubman ................... 372/38.02 |
| 2011/0063115 A1 | 3/2011 | Kishimoto |
| 2011/0280032 A1 | 11/2011 | Kishimoto |

FOREIGN PATENT DOCUMENTS

| | | |
|---|---|---|
| DE | 10 2006 029 204 A1 | 1/2008 |
| DE | 10 2008 028 654 A1 | 12/2009 |
| EP | 0 431 832 A2 | 6/1991 |
| EP | 0 823 759 A2 | 2/1998 |
| EP | 1 624 543 A1 | 2/2006 |
| JP | 2010-103293 A | 5/2010 |

OTHER PUBLICATIONS

German Search Report dated Feb. 22, 2013 with Statement of Relevancy (Six (6) pages).
Chinese Office Action issued in Chinese counterpart application No. 201380031710.4 dated Sep. 5, 2016, with partial English translation (Twenty Two (22) pages).
European Office Action issued in European counterpart application No. 13 741 755.6-1556 dated Nov. 6, 2017 (Four (4) pages).

* cited by examiner

CONTROL APPARATUS FOR DRIVING A LASER DIODE

CROSS REFERENCE TO RELATED APPLICATIONS

This application is a continuation of PCT International Application No. PCT/EP2013/065725, filed Jul. 25, 2013, which claims priority under 35 U.S.C. § 119 from German Patent Application No. 10 2012 213 670.3, filed Aug. 2, 2012, the entire disclosures of which are herein expressly incorporated by reference.

BACKGROUND AND SUMMARY OF THE INVENTION

The invention relates to a control apparatus for driving a laser diode, in particular an electronic circuit for guaranteeing product safety in vehicle lighting installations having a laser diode. Furthermore, the invention relates to a lighting apparatus for a vehicle and a vehicle having a lighting apparatus of this kind.

Laser diodes are increasingly replacing light sources previously used in vehicle headlamps, such as for example light emitting diodes (LEDs), xenon bulbs or filament bulbs. The control units used for conventional illuminants are not suitable for the electrical driving of laser diodes. The electrical and thermal characteristics of semiconductor lasers require control electronics and control logic designed especially for them. For driving purposes, laser diodes necessarily require an upstream electronics unit which takes into account the specific characteristics of this illuminant in order to be able to guarantee a correct and high-quality reproduction of the light functions to be reproduced thereby under the operating conditions prevailing in the vehicle over the lifetime. The new kinds of laser diodes cannot be operated in the vehicle for lighting purposes or be integrated into the on-board vehicle power supply without automotive-qualified control electronics.

Because of the laser radiation present in the system, which can cause severe injuries in the event of an uncontrolled escape, active measures are necessary for ensuring the safety of the product under all operating conditions and fault occurrences. Particularly for the use of light sources which are subject to a laser class classification >1, additional measures are necessary in order to prevent danger to human beings and other creatures due to unintentionally escaping laser radiation.

It is desirable to specify a control apparatus for driving a laser diode, with which it is made possible to operate the laser diode safely and reliably. Furthermore, a lighting apparatus for a vehicle, with which it is made possible to operate a laser diode safely and reliably, is to be specified. Further, a vehicle having a lighting apparatus of this kind is to be specified.

An embodiment of a control apparatus comprises an output connection for connecting the laser diode, a regulation device for generating an output signal at a connection of the regulation device, a detector device which is designed to determine a regulation variable when the regulation device provides the output signal at the connection and the laser diode is connected to the output connection of the control apparatus. Furthermore, the control apparatus comprises a computer device for providing a control signal for the regulation device. The computer device provides the control signal independently of the regulation variable. The regulation device is designed in such a way that it generates a level for the output signal depending on the control signal and the determined regulation variable.

An embodiment of an illumination apparatus for a vehicle comprises a laser diode and a control apparatus for driving the laser diode according to the embodiment specified above. The laser diode is connected to the output connection of the control apparatus.

A regulated driving of laser diodes in vehicle illumination installations can be ensured by means of the specified control apparatus. In doing so, brightness, color temperature and temperature can be controlled. Specific characteristics of laser diodes, for example different brightness classes, can be matched to desired target values. The life of the laser diodes can be controlled by means of electrical and thermal limitation, thus enabling them to be designed for the vehicle life.

The specified control apparatus is also suitable without limitation for the operation of conventional, that is to say spontaneously emitting, LEDs. This enables hybrid headlamps with laser diodes and light emitting diodes to be driven and diagnosed. Some lighting functions in the automotive sector are subject to a functional safety classification (ASIL level). The development process, in particular the hardware and software development, must therefore generally be carried out in accordance with a standard, for example in accordance with ISO 26262.

The invention is explained in more detail below with reference to figures which show exemplary embodiments of the present invention. In the drawings:

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
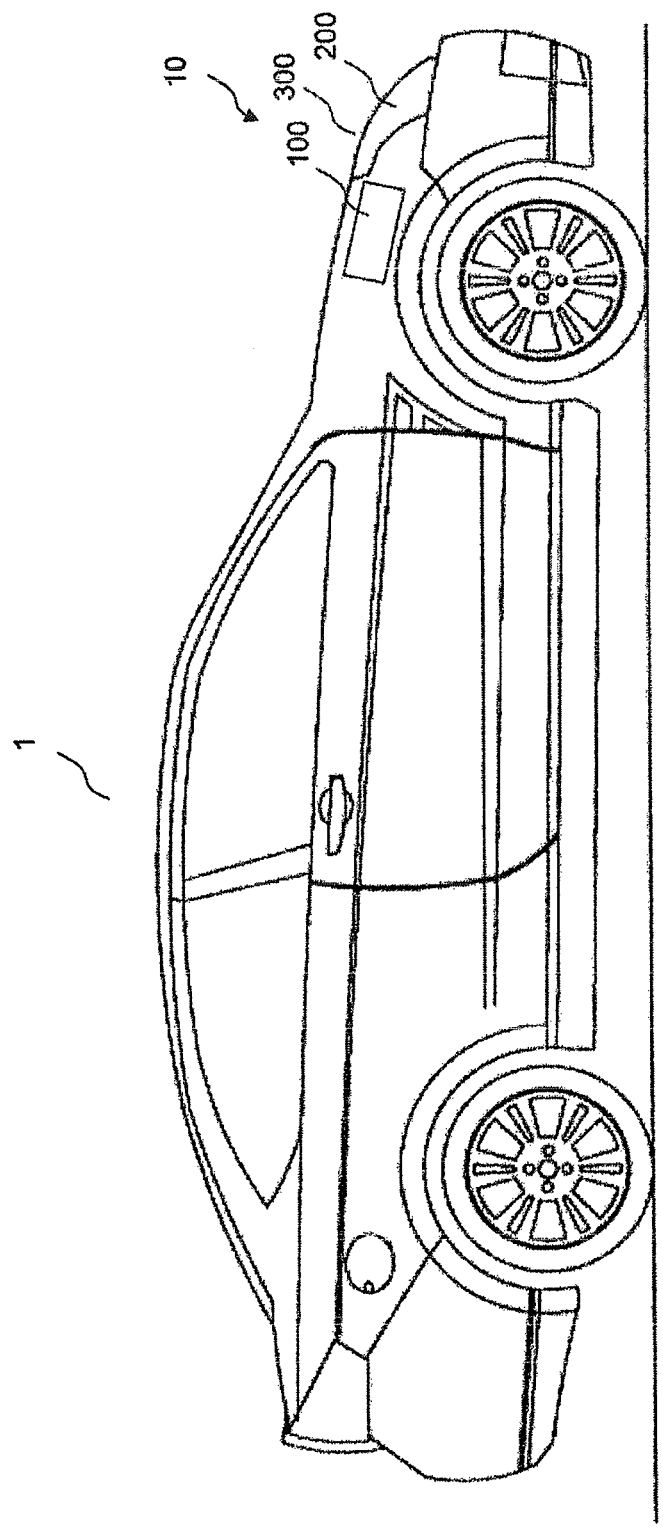
FIG. 1 shows a vehicle with a lighting apparatus having a laser diode module.

FIG. 1 shows a vehicle 1 with a lighting apparatus 10. The lighting apparatus 10 comprises a control apparatus 100, a laser diode module 200 with at least one and preferably with a multiplicity of laser diodes. The laser diode module is arranged in a headlamp or a headlamp housing 300 of the vehicle 1. The laser diodes can be designed as semiconductor laser diodes. In order to operate the semiconductor laser diodes to reproduce different static and dynamic lighting functions in the motor vehicle 1, the laser diode module is coupled to the control apparatus 100 of the lighting apparatus 10. The control apparatus 100 can be designed as an electronic control unit or as an electronic control device for regulated driving of the laser diodes of the laser diode module. For reasons of electromagnetic compatibility and the more elaborate cabling, the control apparatus 100 is fitted as close as possible to the laser diode module and therefore on or in the headlamp 300.

Figure 2:
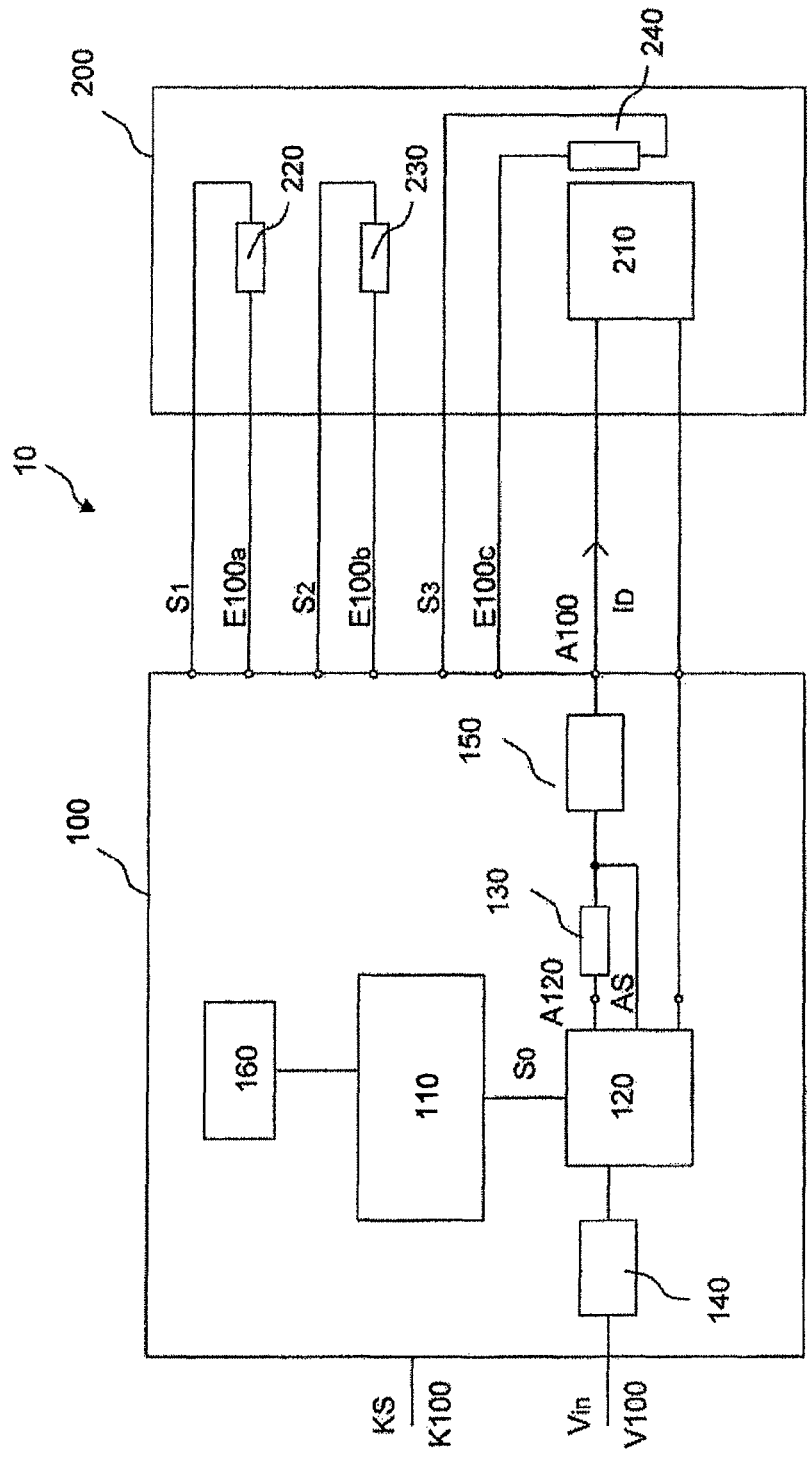
FIG. 2 shows an embodiment of a lighting apparatus having a laser diode module and a control circuit for driving a laser diode.

FIG. 2 shows an embodiment of the lighting apparatus 10 with the control apparatus 100 and the laser diode module 200. The laser diode module has at least one laser diode 210 which is coupled to an output connection A100 of the control apparatus. The control apparatus 100 substantially comprises a logic stage and a power stage. By way of example, the power stage can comprise a regulation device 120 for generating an output signal or a manipulated variable AS at a connection A120. The power stage can, for example, have a plurality of DC/DC switching regulators which are configured as current drivers. Each driver stage can operate a laser diode module. The driver stages can operate the laser diodes cyclically, both in continuous mode and pulsed, or by means of pulse width modulation. This enables variable dimming of the emitted luminous flux, by means of which dynamic and adaptive, in particular vehicle or environment-dependent, lighting functions can be reproduced. For example, the logic stage can comprise a computer device 110 for providing a control signal SO for the regulation devices 120.

Furthermore, the control apparatus 100 comprises a detector device 130 which is designed to determine a regulation variable ID when the regulation device 120 provides the output signal AS at the connection A120 and the laser diode 210 is connected to the output connection A100. The regulation device 120 is designed in such a way that it generates a level for the output signal AS depending on the control signal SO and the determined regulation variable ID. The regulation variable ID can, for example, be the diode current flowing through the laser diode 210. The output signal or the manipulated variable AS can be an output voltage which is generated at the connection A120 of the regulation device 120. When the regulation device is designed as a switching regulator, the output signal which constitutes the manipulated variable can be a switching time of one or more transistors of the switching regulator. The output or diode current ID appears at the output connection A100 of the control apparatus as a function of the manipulated variable.

The control voltage 100 can be connected to the on-board vehicle power supply by means of interfaces K100, V100. In the exemplary embodiment of FIG. 1, the control apparatus 100 receives command signals KS at a communications connection K100, for example, and a supply voltage Vin at a supply voltage connection V100. Different functions of the laser diode module 200, for example, can be activated by means of the command signals fed to the communications connection K100. As an example, the control apparatus 100 receives information by means of the command signals KS regarding which lighting functions on the laser diode module 200 are to be switched on. Furthermore, a diagnostic message is sent back via the bus cables connected to the communications connection K100 from the control apparatus 100 to a further control device which is connected to the communications connection K100.

The computer device 110 can be designed as a microcontroller which undertakes the functional control of the power stage, in particular of the regulation device 120, as well as its parameterization. The control signal SO is generated by the computer device 110, for example depending on the command signal KS. As an example, the control signal SO contains information for the regulation device 120 regarding the level of the diode current ID which is to be provided by the regulation device 120. By means of the control signal SO, operating variables of the laser diode module, for example the desired current through the laser diodes, a PWM (pulse width modulation) frequency and a PWM mark/space ratio, can be set by the computer device 110. For example, the control signal SO specifies a desired level of the diode current ID. Depending on the control signal SO, the regulation device 120 generates the output signal or the manipulated variable AS at the connection A120.

Depending on the level of the output signal AS and an operating state of the laser diode 210, an actual level of the diode current ID appears at the output connection A100. The diode current ID forms the actual regulation variable. The actual level of the diode current is determined by the detector device 130. The detector device 130 can, for example, be a current sensor which is arranged in the current path to the laser diode module. The regulation device 120 is designed to compare the actual level of the diode current with the desired level of the diode current specified by the computer device 110 by means of the control signal SO, and to vary the output signal or the manipulated variable AS accordingly when the desired level of the diode current differs from the actual level.

The detector device 130 can be designed to determine a level of an output current or diode current ID flowing via the output connection A100. The detector device can be arranged between the output connection A100 and the regulation device 120. The detector device 130 can have a resistor, for example, which is connected to the connection A120 of the regulation device 120. A voltage, for example, can be tapped off from the resistor. The regulation device 120 can have an evaluation unit for determining the level of the output current ID by evaluating the voltage dropped at the resistor.

The control device 100 can interrupt the generation of the output current ID if the level of the output current ID exceeds a threshold. The regulation device 120 can contain switching regulator ICs, for example, which carry out an electrical monitoring of the laser diodes and their electrical connection. Monitoring the diode current ID by means of the detector device 130 enables short circuits and interruptions to be diagnosed. If a fault is diagnosed, defined states are assumed. For example, the control device 100 effects an immediate shutdown of the laser module by interrupting the generation of the output signal AS.

The control apparatus 100 is designed in such a way that the residual ripple of the output current ID through the diodes 210 of the laser diode module is minimal, for example less than 5% fs (full scale). Due to the high sensitivity of the laser diodes with regard to an electrical overload, which can result in a high current/voltage peak and lead to destruction of the laser diode module in a very short time, for example in a few nanoseconds, the reliable prevention thereof is a central requirement in the selection of the driver topology and the component sizing.

In the embodiment of the control apparatus shown in FIG. 2, filtering with respect to the electrical on-board vehicle power supply is provided in order to keep, in particular, transient voltage changes in the supply away from the laser diodes. For this purpose, the control apparatus 100 has a filter circuit 140 which is provided for filtering out transient voltage changes of the supply voltage Vin from the on-board vehicle power supply. Furthermore, the control apparatus 100 can include a filter circuit 150 which is connected between the detector device 130 and the output connection A100. The filter circuit 150 is designed to filter out a current and voltage ripple from the output signal of the regulation device.

When generating the control signal SO, the computer device 110, or a microprocessor contained therein, takes into account further illuminant-specific characteristics which can be stored as a characteristic curve, characteristic field or algorithm in a non-volatile memory and be included in the calculation of the manipulated variable SO or the operating parameters to be set thereby. For example, the control apparatus 100 has a storage device 160 for storing the illuminant-specific characteristics of the laser diode 210. For the purpose of accessing the storage device 160, the computer device 110 is coupled thereto. The storage device 160 can, for example, be designed as a non-volatile memory of the control device 100.

The subjective perception of the emitted luminous intensity of a laser diode is not proportional to the arithmetic mean of the electrical power, as a result of which the brightness spectrum used can be corrected by the computer device 110 with the help of a characteristic curve and thus be optically linearized. The characteristic curve can, for example, also be stored in the storage device 160. An ageing characteristic of the laser diode 110, which contains a relationship between the reduction in the luminous flux against operating time and temperature, can also be stored in the storage device 160. By generating the control signal SO by means of the computer device 110 as a function of the ageing characteristic of the laser diode, it can be guaranteed that a constant luminous flux is generated over the whole life of the laser diode module.

Furthermore, a binning class of the laser diodes present in the laser diode module can also be taken into account by the computer device 110 when generating the control signal SO. The binning class denotes a brightness and color sortation of the laser diode 210. The binning class associated with the laser diode can likewise be stored in the storage device 160. The binning classes incorporated in every specific laser diode module can, for example, be written to the non-volatile memory 160 of the control device 100 during the production process of the lamp 300 by means of coding, or read in by the microcontroller of the computer device 110 by means of an ohmic resistor with defined value ranges which is incorporated with the laser diode module. The brightness of the different binning classes can be aligned by the computer device 110 by modifying the mark/space ratio of the pulse width modulation. The chromaticity coordinate can be adjusted in a limited range by a variable ratio of peak current and PWM mark/space ratio at constant power. This is possible due to the chromaticity coordinate drift against peak current which is characteristic for semiconductor laser diodes.

The computer device 110 generates the control signal SO depending on the stored illuminant-specific characteristics so that the magnitude of the diode current ID or the PWM frequency and PWM mark/space ratio are specified by the computer device 110 for the regulation device 120 in accordance with the illuminant-specific characteristics.

The control apparatus 100 includes an input connection E100a for connecting a sensor 220 which is designed to determine a temperature of the laser diode 210. The temperature sensor 220 generates a sensor signal S1 depending on the determined temperature of the laser diode 210. The computer device 110 generates the control signal SO depending on the sensor signal S1. The computer device 110 can generate the control signal SO in such a way, for example, that the regulation device 120 interrupts the generation of the output signal AS if, after evaluating the sensor signal S1, the computer device 110 establishes that the temperature of the laser diode 210 determined by the temperature sensor 220 lies above a threshold.

A sensor for measuring the temperature of the module can be provided on every laser diode module of a vehicle. Knowing the thermal transfer resistances between the position of the sensor and the depletion layer of the diode crystal and the thermal inertia of the system, the depletion layer temperature of the laser diode is calculated by the computer device 110 from the measured value. The depletion layer temperature likewise constitutes a control variable, as a function of which the power of the laser diode module is regulated. In this way, overheating can be prevented, or, in the event that limiting temperatures stored in the computer device 110 are exceeded, the laser diode module can be shut down to protect the components.

The control apparatus 100 has a further input connection E100b for connecting a sensor 230 which is designed to establish a correct or erroneous operating state of the laser diode 210. The input connection E100b is designed in particular for receiving a sensor signal S2 generated by the sensor 230 depending on the established operating state of the laser diode. The computer device 110 generates the control signal SO depending on the sensor signal S2. In particular, the computer device 110 generates the control signal SO in such a way that the regulation device 120 interrupts the generation of the output signal AS if, after evaluating the sensor signal S2, the computer device 110 establishes that the laser diode 210 is in the erroneous operating state.

The further sensor 230 is therefore designed as a safety sensor for guaranteeing the imposed product safety requirements, which sensor can be evaluated by the CPU 110. The sensor 230 prevents hazardous laser radiation escaping either in the event of component failures or in the event of damage to the laser module. The sensor 230 can contain an electrically conductive material, for example, which is applied in a meandering or spiral structure to the entire laser module, including any fiber optic cables and the light emission surface. The two ends of the conductor can be connected to the control device 110 which monitors the electrical continuity. In the event of a mechanical defect, material failure or damage due to external influences, for example due to an accident, the electrical resistance of the conducting material becomes high. If a limiting value is exceeded, this is detected by the computer device 110 as a fault and the control signal SO is generated such that the laser diode module affected is shut down in the interests of product safety.

As a result of the non-photo-based monitoring of the laser diode module, diagnosis of the module is possible even when the laser module is switched off. The read-out cycle of the sensor evaluation, the de-bounce time and the run time of the software response are designed so that the required maximum permissible emission time of laser radiation, for example an emission time of less than 1 ms, is not exceeded.

Furthermore, as an alternative to the described sensor concept of the sensors 220 and 230, the control apparatus 100 can include a further sensor 240. The control apparatus 100 also has an input connection E100c for connecting the sensor 240. The sensor 240 is designed for measuring the luminous flux of the laser diode 210. The sensor 240 generates a sensor signal S3, which is fed to the input connection E100c, depending on the measured luminous flux of the laser diode 210. The computer device 110 generates the control signal SO depending on the sensor signal S3. The computer device 110 can generate the control signal SO in such a way that the regulation device 120 interrupts the generation of the output signal AS if, after evaluating the sensor signal S3, the computer device 110 establishes that the luminous flux generated by the laser diode 210 lies above or below a limiting value and/or the spectral composition of the light emitted by the laser diode is situated in a forbidden range.

The sensor 240 can, for example, contain a photosensitive resistor. This is fitted near to the light emission surface and any conversion layers of the laser diode and serves to measure the illumination level of the laser diode 210, by means of which the total emitted luminous flux can be calculated. In doing so, the dihedral angle covered by the sensor and the spectral line sensitivity must be taken into account. The luminous flux can be used as a control variable for electrical driving and also enables the functional capability of the optical system to be monitored, that is to say, in particular, a failure or fault of illuminants, fiber-optic cables, converters or other optical elements used. Also in this embodiment, after evaluation of the sensor signal S3, the control signal SO is generated by the computer device 110 in such a way that, if a fault should be detected, a laser diode module affected by the fault is shut down.

LIST OF REFERENCES

1 Vehicle
10 Lighting apparatus
100 Control apparatus
110 Computer device
120 Regulation device
130 Detector device
140 Filter circuit
150 Filter circuit
160 Storage device
200 Laser diode module
210 Laser diode
220 Temperature sensor
230 Safety sensor
240 Sensor for measuring the luminous flux
300 Headlamp
AS Output signal
ID Diode current
SO Control signal
S1, . . . , S3 Sensor signal The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A control apparatus for driving a laser diode of a vehicle headlamp, the control apparatus comprising:
    an output connection connecting the control apparatus to a laser diode module including the laser diode of the vehicle headlamp, the laser diode module being external to the control apparatus and connected thereto via the output connection;
    a regulation device with a connection between the regulation device and the output connection, the regulation device generating an output signal that is provided at the connection;
    a detector device that determines a laser diode current at the connection when the regulation device provides the output signal at the connection and the laser diode is connected to the output connection, the detector device receiving the output signal at the connection and outputting the output signal to the output connection; and
    a computer device that provides a control signal to the regulation device, the control signal containing information indicating the laser diode current, wherein the computer device generates and provides the control signal independently of the laser diode current, and
    wherein the regulation device generates a level for the output signal depending on the control signal and the determined laser diode current.

2. The control apparatus as claimed in claim 1, further comprising:
    a first input connection connecting a first sensor, which is configured to determine a temperature of the laser diode, wherein the first input connection is configured to receive a first sensor signal generated by the first sensor depending on the determined temperature of the laser diode,
    wherein the computer device generates the control signal depending on the first sensor signal.

3. The control apparatus as claimed in claim 1, further comprising:
    a second input connection connecting a second sensor, which is configured to establish a correct or erroneous operating state of the laser diode, wherein the second input connection is configured to receive a second sensor signal generated by the second sensor depending on the established operating state of the laser diode,
    wherein the computer device generates the control signal depending on the second sensor signal.

4. The control apparatus as claimed in claim 1, further comprising:
    a third input connection for connecting a third sensor which is configured to measure the luminous flux of the laser diode, wherein the third input connection is configured to receive a third sensor signal generated by the third sensor depending on the measured luminous flux of the laser diode,
    wherein the computer device generates the control signal depending on the third sensor signal.

5. The control apparatus as claimed in claim 1, wherein the detector device is configured to determine a level of an output current flowing via the output connection, wherein the detector device is arranged between the output connection and the regulation device,
    wherein the control apparatus is configured such that the generation of the output current is interrupted if the level of the output current exceeds a threshold.

6. The control apparatus as claimed in claim 5, wherein the detector device has a resistor and the regulation device is configured to determine the level of the output current by evaluating the voltage dropped at the resistor.

7. The control apparatus as claimed in claim 1, wherein the regulation device is configured to interrupt the generation of the output signal.

8. The control apparatus as claimed in claim 1, further comprising:
    a supply voltage connection for connecting a supply voltage; and
    a filter circuit for filtering out transient voltage changes of the supply voltage and for filtering out a current and voltage ripple at the output connection.

9. The control apparatus as claimed in claim 1, further comprising:
    a storage device for storing illuminant-specific characteristics of the laser diode to be connected to the output connection,
    wherein the control device generates the control signal depending on the illuminant-specific characteristics.

10. The control apparatus as claimed in claim 9,
    wherein an ageing characteristic, which contains the relationship between the brightness of the laser diode to be connected and the operating time of the laser diode, is stored in the storage device, and/or wherein at least one parameter, which contains a brightness and/or color sortation of the laser diode to be connected, is stored in the storage device, wherein the control device generates the control signal depending on the ageing characteristic and/or depending on the at least one parameter.

11. The control apparatus as claimed in claim 1, wherein the laser diode current is provided to the regulation device without being provided to the computer device such that the control signal is generated independently from the determined laser diode current.

12. A lighting apparatus for a vehicle headlamp, comprising:

a laser diode of the vehicle headlamp; and
a control apparatus for driving the laser diode, wherein the control apparatus comprises:
the output connection connecting the control apparatus to a laser diode module that includes the laser diode, the laser diode module being external to the control apparatus and connected thereto via the output connection,
a regulation device, with a connection between the regulation device and the output connection, the regulation device configured to generate an output signal that is provided at the connection,
a detector device that determines a laser diode current at the connection when the regulation device provides the output signal at the connection and the laser diode is connected to the output connection, the detector device receiving the output signal at the connection and outputting the output signal to the output connection and
a computer device that provides a control signal for the regulation device, the control signal containing information indicating the laser diode current, wherein the computer device generates and provides the control signal independently of the regulation variable,
wherein the regulation device generates a level for the output signal depending on the control signal and the determined laser diode current.

13. The lighting apparatus for a vehicle as claimed in claim 12, further comprising:

a temperature sensor configured to determine a temperature of the laser diode, which temperature sensor is connected to a first input connection of the control apparatus, wherein the temperature sensor generates the first sensor signal depending on the determined temperature of the laser diode,
wherein the computer device generates the control signal in such a way that the regulation device interrupts the generation of the output signal if, after evaluating the first sensor signal, the computer device establishes that the temperature of the laser diode determined by the temperature sensor lies above a threshold.

14. The lighting apparatus for a vehicle as claimed in claim 12, further comprising:

a second sensor configured to establish a correct or erroneous operating state of the laser diode, which is connected to a second input connection of the control apparatus,
wherein the computer device generates the control signal in such a way that the regulation device interrupts the generation of the output signal if, after evaluating the second sensor signal, the computer device establishes that the laser diode is in the erroneous operating state.

15. The lighting apparatus for a vehicle as claimed in claim 12, further comprising:

a third sensor configured to measure the luminous flux of the laser diode, which is connected to a third input connection of the control apparatus,
wherein the computer device generates the control signal in such a way that the regulation device interrupts the generation of the output signal if, after evaluating the third sensor signal, the computer device establishes that the luminous flux generated by the laser diode lies above or below a limiting value and/or the spectral composition of the light emitted by the laser diode is situated in a forbidden range.

16. The lighting apparatus for a vehicle as claimed in claim 12, wherein the laser diode current is provided to the regulation device without being provided to the computer device such that the control signal is generated independently from the determined laser diode current.

17. A vehicle, comprising a vehicle headlamp, wherein the vehicle headlamp comprises a laser diode and a control apparatus for driving the laser diode of the vehicle headlamp, wherein the control apparatus comprises:

an output connection connecting the control apparatus to a laser diode module that includes the laser diode of the vehicle headlamp, the laser diode module being external to the control apparatus and connected thereto via the output connection,
a regulation device with a connection between the regulation device and the output connection, the regulation device generating an output signal that is provided at the connection,
a detector device that determines a laser diode current at the connection when the regulation device provides the output signal at the connection and the laser diode is connected to the output connection, the detector device receiving the output signal at the connection and outputting the output signal to the output connection, and
a computer device that provides a control signal for the regulation device, the control signal containing information indicating the laser diode current, wherein the computer device generates and provides the control signal independently of the laser diode current,
wherein the regulation device generates a level for the output signal depending on the control signal and the determined laser diode current.

18. The vehicle as claimed in claim 17,
wherein the lighting apparatus further comprises a temperature sensor configured to determine a temperature of the laser diode, which temperature sensor is connected to a first input connection of the control apparatus, wherein the temperature sensor generates the first sensor signal depending on the determined temperature of the laser diode,
wherein the computer device generates the control signal in such a way that the regulation device interrupts the generation of the output signal if, after evaluating the first sensor signal, the computer device establishes that the temperature of the laser diode determined by the temperature sensor lies above a threshold.

19. The vehicle as claimed in claim 17,
wherein the lighting apparatus further comprises a second sensor configured to establish a correct or erroneous operating state of the laser diode, which is connected to a second input connection of the control apparatus,
wherein the computer device generates the control signal in such a way that the regulation device interrupts the generation of the output signal if, after evaluating the second sensor signal, the computer device establishes that the laser diode is in the erroneous operating state.

20. The vehicle as claimed in claim 17,
wherein the lighting apparatus further comprises a third sensor configured to measure the luminous flux of the laser diode, which is connected to a third input connection of the control apparatus,
wherein the computer device generates the control signal in such a way that the regulation device interrupts the generation of the output signal if, after evaluating the third sensor signal, the computer device establishes that the luminous flux generated by the laser diode lies above or below a limiting value and/or the spectral composition of the light emitted by the laser diode is situated in a forbidden range.

21. The vehicle as claimed in claim 17, wherein the laser diode current is provided to the regulation device without being provided to the computer device such that the control signal is generated independently from the determined laser diode current.

* * * * *